(12) United States Patent
Johnson et al.

(10) Patent No.: US 7,808,794 B2
(45) Date of Patent: Oct. 5, 2010

(54) MEDIA STORAGE SYSTEMS AND CONTROL PANEL FOR USE THEREWITH

(75) Inventors: Kristianne E. Johnson, Fort Collins, CO (US); Paul C. Coffin, Battle Ground, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2318 days.

(21) Appl. No.: 10/403,358

(22) Filed: Mar. 31, 2003

(65) Prior Publication Data

US 2004/0190395 A1     Sep. 30, 2004

(51) Int. Cl.
*H05K 5/00*     (2006.01)
*H05K 7/16*     (2006.01)

(52) U.S. Cl. ............... 361/725; 361/724; 361/726; 361/727

(58) Field of Classification Search ............ 361/724, 361/725, 726, 727
See application file for complete search history.

(56) References Cited

U.S. PATENT DOCUMENTS

| | | | |
|---|---|---|---|
| 5,388,032 A * | 2/1995 | Gill et al. ............... | 700/17 |
| 5,604,662 A | 2/1997 | Anderson et al. | |
| 6,031,795 A | 2/2000 | Wehmeyer | |
| 6,243,328 B1 | 6/2001 | Fenner et al. | |
| 6,272,573 B1 | 8/2001 | Coale et al. | |
| 6,856,505 B1 * | 2/2005 | Venegas et al. ........ | 361/679.05 |
| 2002/0078290 A1 | 6/2002 | Derrico et al. | |
| 2002/0079791 A1 | 6/2002 | Sucharczuk et al. | |
| 2002/0090846 A1 | 7/2002 | Abboud | |
| 2003/0005199 A1 | 1/2003 | Meert et al. | |
| 2003/0049105 A1 | 3/2003 | Mueller et al. | |

FOREIGN PATENT DOCUMENTS

EP      1047292      10/2000

\* cited by examiner

*Primary Examiner*—Jayprakash N Gandhi
*Assistant Examiner*—Anthony M Haughton

(57) ABSTRACT

Media storage system and control panel for use therewith. One embodiment of the control panel may comprise a frame assembly, and a quick-release attachment system operable to readily mount the frame assembly to the media storage system and readily release the frame assembly from the media storage system.

16 Claims, 4 Drawing Sheets

MEDIA STORAGE SYSTEMS AND CONTROL PANEL FOR USE THEREWITH

FIELD OF THE INVENTION

The invention generally pertains to media storage systems, and more specifically, to control panels for use therewith.

BACKGROUND

Media storage systems are commonly used to store data cartridges at known locations and to retrieve the desired data cartridges so that data may be written to and/or read from the data cartridges. Such media storage systems are often referred to as autochangers or library storage systems.

Such media storage systems may include one or more storage libraries with storage magazines that serve as storage locations for the data cartridges, and a read/write device to read and/or write data on the data cartridges. The media storage system may also include a cartridge-handling system (e.g., a "picker"), as well as a drive system for moving among the data cartridges stored in the storage libraries.

One of the advantages of a media storage system is the ability to readily expand its capacity by adding more storage libraries to the media storage system. Each of the storage libraries may be provided with additional storage magazines for storing data cartridges. In any event, the storage libraries may be arranged adjacent one another and the cartridge-handling system can be operated to move between each of the storage libraries and access the data cartridges therein.

Media storage systems may include a primary storage library. The primary storage library may be provided with controls (e.g., an on/off switch) mounted thereto for use by an operator or administrator of the media storage system. Secondary storage libraries can then be added to the primary storage library to expand the storage capacity of the media storage system. According to such a design, however, the primary storage library and the controls provided thereon typically end up on the very bottom or at the very top of the media storage system when the secondary storage libraries are added.

Such an arrangement may be cumbersome and inconvenient for the administrator or operator. For example, it may be difficult for the operator to see and/or reach the controls. Although each storage library may be provided with controls (i.e., all primary storage libraries), such redundancy needlessly increases the cost of the media storage system. In addition, rearranging the primary and secondary storage libraries so that the primary storage library and the controls are at a convenient position for the operator can be a time-consuming process. Manually rearranging the storage libraries thus increases operation costs and the down-time of the media storage system.

Furthermore, manufacturing different types of storage libraries (i.e., primary and secondary storage libraries) increases the cost of manufacture and inventory. For example, the different types of storage libraries must each be accessible at the warehouse and easily identifiable from one another for shipping and handling purposes.

SUMMARY OF THE INVENTION

Media storage system and control panel for use therewith. One embodiment of the control panel comprises a frame assembly and a quick-release attachment system. Quick-release attachment system is operable to readily mount the frame assembly to the media storage system and readily release the frame assembly from the media storage system.

BRIEF DESCRIPTION OF THE DRAWINGS

Illustrative and presently preferred embodiments of the invention are shown in the drawings, in which.

DETAILED DESCRIPTION

Figure 1:
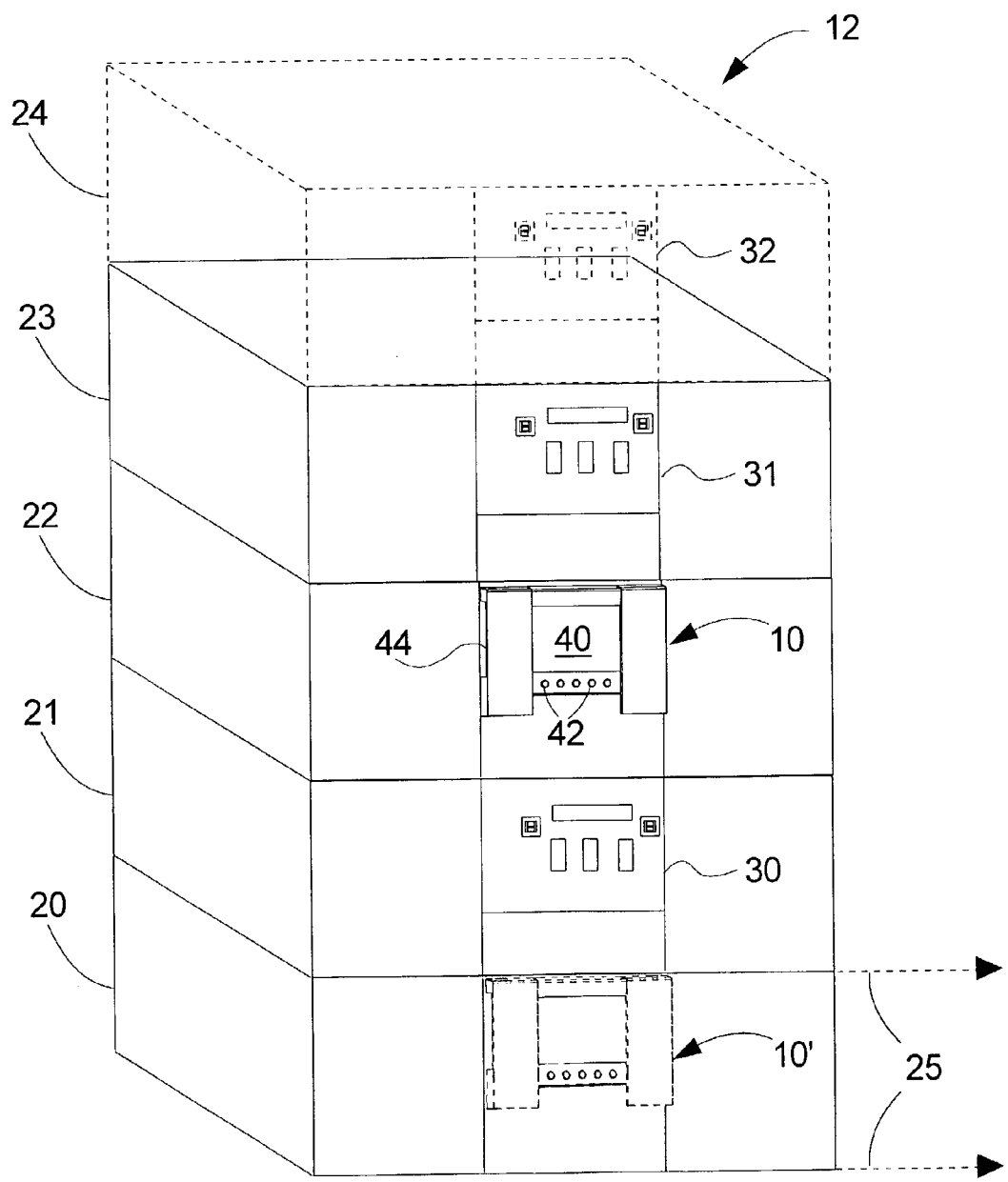
FIG. 1 is a perspective view of a media storage system and a control panel for use therewith according to one embodiment of the invention.

Control panel 10 is shown and described herein as it may be used with media storage system 12 (FIG. 1). Media storage system 12 generally comprise one or more storage libraries 20. The storage libraries house a number of cartridge-receiving devices (e.g., storage magazines) for storing a plurality of data cartridges therein. The data cartridges may be accessed using a picker assembly, and transported to a read/write device to access the data stored thereon.

Additional storage libraries 21-23 (FIG. 1) may be added to media storage system 12 to provide more storage capacity. The storage libraries (hereinafter generally referred to as 20 unless referencing a specific storage library) may be arranged adjacent one another. For example, storage libraries 20 may be stacked one on top of another, as shown in FIG. 1. Still more storage libraries 20 may be stacked on top of one another as indicated by storage library 24 (shown by dashed lines in FIG. 1). Other arrangements are also possible. For example, storage libraries 20 may be stacked next to one another (indicated by lines 25 in FIG. 1). The particular configuration, including the number of storage libraries 20 that are used, may depend upon various design considerations. By way of example, such considerations may include the physical space available and the desired dimensions of the media storage system 12.

According to preferred embodiments of the invention, each of the storage libraries 20 may be manufactured substantially the same as one another. That is, each of the storage libraries 20 may comprise a designated region 30, 31, and 32 (referred to generally as 30) for mounting control panel 10 thereto, but need not include separate controls. Instead, only one control panel 10 is supplied for use with the media storage system 12, regardless of the number of storage libraries 20 provided or later added to the media storage system 12. Such a design advantageously reduces the cost of manufacturing and inventorying, and makes expansion of the media storage system 12 easier.

Control panel 10 may be mounted to one of the storage libraries 20 and provides a user-interface at the desired position on the media storage system 12. Generally, control panel 10 comprises one or more output devices 40 (e.g., a suitable display) and/or input devices 42 (e.g., a keypad having one or more keys 44). Accordingly, the user may view information, and/or manually control operation of the media storage system 12 using control panel 10 without having to access the media storage system 12 through a networked computer. Control panel 10 is described in more detail below with respect to one of the preferred embodiments of the invention.

The foregoing description of the media storage system 12 is provided in order to better understand one environment in which control panel 10 of the present invention may be used. It should be understood that control panel 10 may also be used in conjunction with any of a wide range of other types and configurations of media storage systems, now known or that may be developed in the future.

According to preferred embodiments of the invention, control panel 10 for use with media storage system 12 is movable. That is, control panel 10 can be mounted to any one of the storage libraries 20, readily removed, and remounted to another of the storage libraries 20, preferably without the need for tools.

By way of illustration, when the media storage system 12 comprises a single storage library 20, control panel 10 is mounted to that storage library 20, as shown by the dashed control panel 10' in FIG. 1. When more storage libraries 21-23 are added to the media storage system 12, it may be desirable to mount control panel 10 on another one of the storage libraries 21-23. For example, it may be cumbersome or inconvenient for the operator to read the display 40 when control panel 10' is mounted to the bottom storage library 20. Therefore, the operator may prefer to have control panel 10 mounted higher up on the media storage system 12.

Accordingly, the operator can remove control panel 10 from the first storage library 20 (e.g., by pulling it off of the bottom storage library 20), and remounting it to one of the other storage libraries 20 (e.g., by pressing it onto storage library 22). Control panel 10 may thus be conveniently mounted on the media storage system 12 as desired by the operator.

Figure 2:
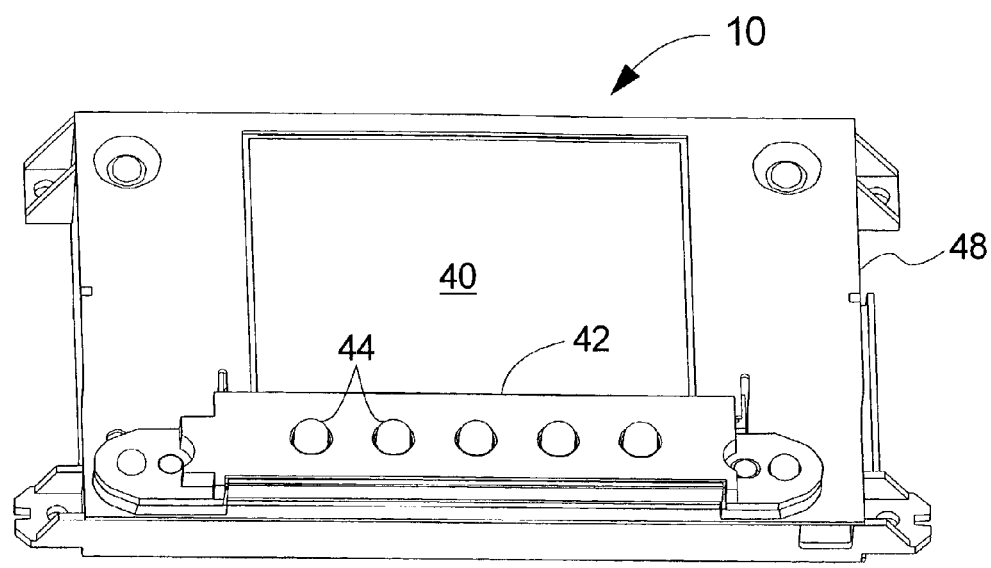
FIG. 2 is a perspective view of one embodiment of a housing for a control panel.
Figure 3:
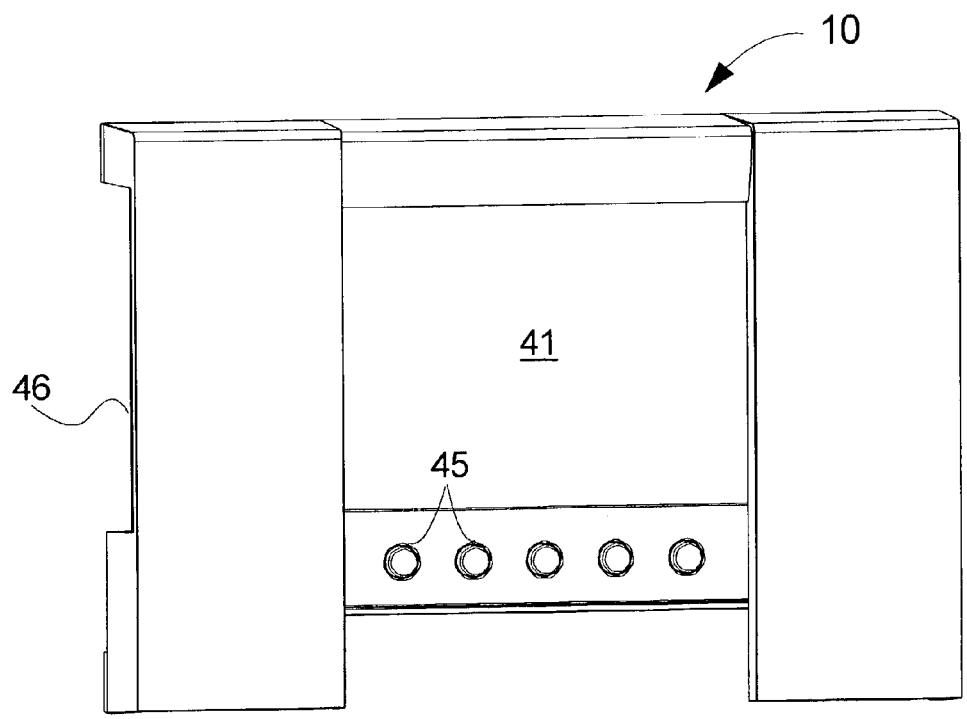
FIG. 3 is a perspective view of the front side of one embodiment of a control panel housing.
Figure 4:
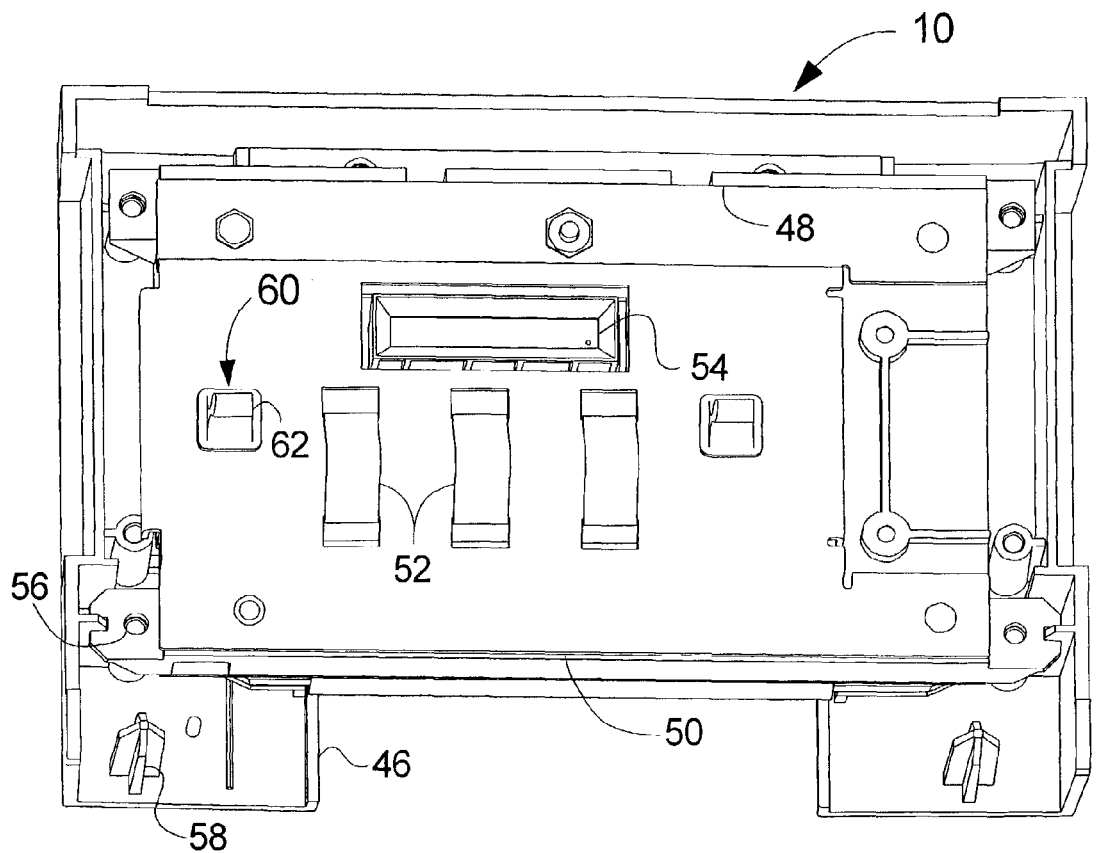
FIG. 4 is a perspective view of the back side of one embodiment of a control panel.
Figure 5:
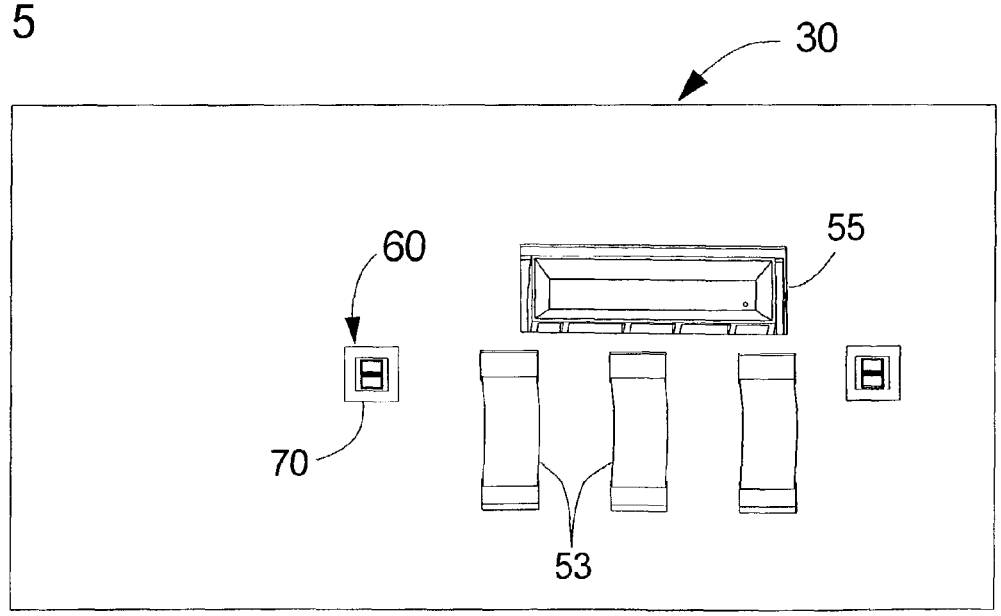
FIG. 5 is a perspective view of a mounting region on the media storage system, upon which the control panel can be mounted according to one embodiment of the invention.

One embodiment of control panel 10 for use with media storage system 12 is shown in more detail in FIG. 2 through FIG. 4. Control panel 10 comprises a frame assembly 48 (FIG. 2). In this embodiment, at least one output device 40 is mounted to the frame assembly 48, and relays an output signal from the media storage system 12, for example, to the operator. Also in this embodiment, at least one input device 42 is mounted to the frame assembly 48, and receives an input signal, for example, from the operator. Input device 42 may then relay the input signal to the media storage system 12 (e.g., a central control system). Of course it is understood that other embodiments may comprise combined input and output devices, or only one type of device (e.g., input or output).

Any suitable output device(s) 40 may be provided for control panel 10 according to the teachings of the invention. In a preferred embodiment, output device 40 is a built-in display, such as a liquid-crystal display (LCD). However, other output devices may include, but are not limited to one or more indicator lights, a printer, audio output (e.g., one or more speakers), or any of a variety of output ports for linking to external output devices (e.g., an external memory system, an external display). Accordingly, output device(s) 40 may be used for relaying information to the operator, such as status messages (e.g., "Error", "Data Cartridge Jammed", "Read/Write Operation In Progress"), instructional messages (e.g., "Clear Cartridge Jam In Drawer 2", "Reset"), operational parameters (e.g., "Power-On", "Drawer Open"), among others.

Likewise, any suitable input device(s) 42 may be provided for control panel 10 according to the teachings of the invention. In a preferred embodiment, input device 42 is a built-in keypad having a number of keys 44. However, other input devices may include one or more switches, buttons, knobs, alpha-numeric keys, programmed or programmable function keys, audio input, or a combination thereof. In other embodiments, the input device 42 may comprise any of a variety of input ports for linking to external input devices (e.g., an external keyboard or keypad). Of course it is understood that the output device 40 and the input device 42 may be integrated with one another. For example, control panel 10 may comprise one or more input/output (I/O) ports for linking to a computer system (e.g., a repair technician's laptop computer).

One embodiment of control panel 10 may also comprise a housing 46, such as that shown in FIG. 3. The housing 46 may be fitted or otherwise mounted on frame assembly 48 of control panel 10. Housing 46 generally serves to protect control panel 10 from the environment (e.g., dust, dirt on the operator's fingers, moving objects such as a passing broom handle, etc.) and from wear due to use of control panel 10.

Housing 46 is shown mounted to control panel 10 according to one embodiment in FIG. 4. For example, housing 46 may be mounted to frame assembly 48 using screws or push-tabs inserted through openings 56 in frame assembly 48. However, it is understood that housing 46 may be mounted in any suitable manner.

Spacers 58 are also shown in FIG. 4 mounted to housing 46 and serve to maintain control panel 10 at a predetermined distance from storage library 20. For example, spacers 58 prevent damage to the electrical components and/or connectors 52, 54 on media storage system 12 during mounting of the control panel 10 to the storage library 20. Spacers 58 may be made from any suitable material (e.g., plastic, metal) and may be mounted to the control panel 10 in any suitable manner (e.g., formed thereon).

Again with reference to FIG. 3, one embodiment of housing 46 comprises a transparent cover 41 (e.g., made from clear plastic) for output device 40 and covers 45 for input devices 44. When the housing 46 is mounted to the frame assembly 48 of control panel 10, transparent cover 41 overlays output device 40 and flexible covers 45 overlay input device 44. Transparent cover 46 may also serve to reduce glare on the display. Of course any suitable covers may be provided for the various types of input and output devices provided with control panel 10.

It is understood that control panel 10 is not limited to use with housing 46 shown and described herein. In another embodiment, housing 46 may be integrated with the components of control panel 10. For example, an opening may be provided in place of transparent cover 41 through which the output device 40 can be fitted. Similarly, covers 45 may instead be provided as openings through which the input device(s) 42 can be fitted. In another embodiment, control panel 10 may not comprise a housing.

The back of control panel 10 is shown in FIG. 4 according to one embodiment of the invention. A controller board 50, such as a printed circuit board or computer board, may be mounted to the frame assembly 48. For example, output device 40 and input device 42 may be linked to controller board 50. Electronic circuitry, a suitable processor (not shown), and/or other electronic components may also be linked to controller board 50.

According to a preferred embodiment, controller board 50 at least comprises connectors 52, 54 for linking control panel 10 to the media storage system 12. For example, connectors 52, 54 may be used to provide control panel 10 with electrical power. Connectors 52, 54 may also serve as a signal link between the media storage system 12 and the various electronic components provided with control panel 10 (e.g., output signals for display 40, input signals from keys 45).

Control panel 10 may be mounted to any one of the storage libraries 20 of the media storage system 12. Control panel 10 is mounted in designated region 30 on the front panel of each storage library 20. Region 30 comprises one or more couplings 70 to receive mating coupling(s) 62 provided on control panel 10 for mounting control panel 10 to storage library 20. Region 30 may also comprise connectors 53, 55 to receive mating connectors 52, 54 provided on control panel 10 for electrically linking control panel 10 to media storage system 10. For example, connectors 53, 55 and 52, 54 may include links for electrical power, ground, and for various signals.

Connectors 53, 55 and 52, 54 may comprise any suitable connectors. For example, connectors 52, 53 are shown as spring-type connectors which flex when pressed against one another to physically contact one another. Another exemplary connector 54, 55 is shown as a pin-connector. Other connectors, now known or later developed are also contemplated as being suitable for use with control panel 10 according to the teachings of the present invention. Indeed, the links between control panel 10 and media storage system 12 need not be physical connections and may also include infrared (IR), radio-frequency (RF), or other remote connections. Preferably the connectors are hot-swapable. That is, the connectors can be connected and disconnected by making physical contact with one another, without having to first disconnect the power.

Figure 6:
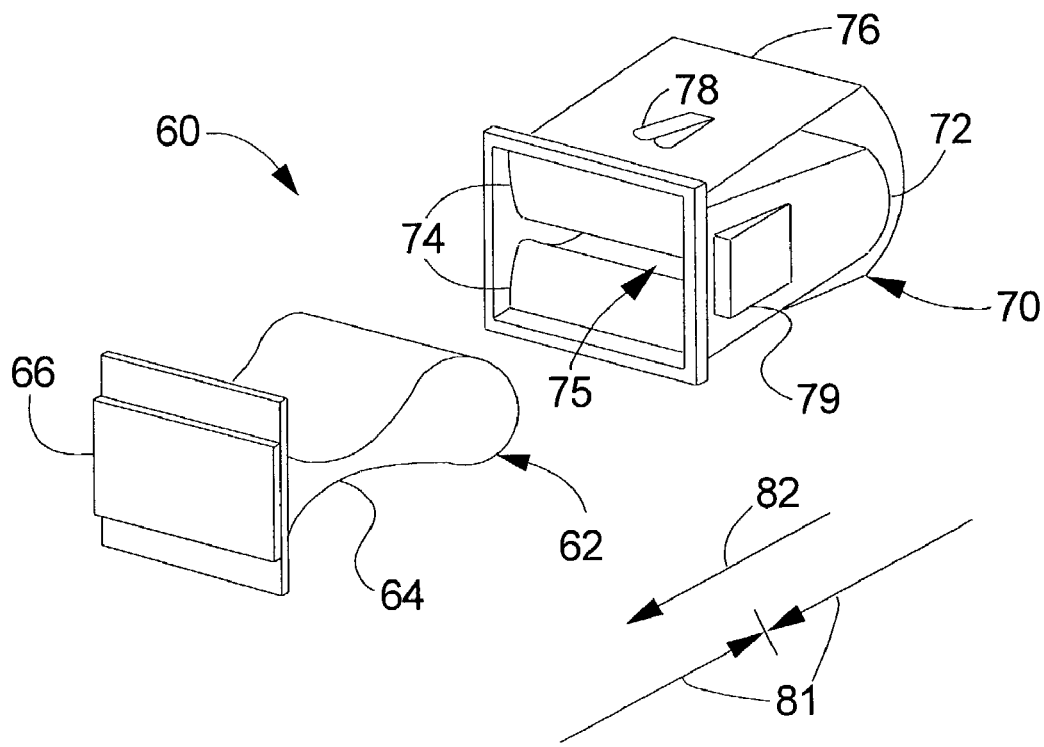
FIG. 6 is a perspective view of one embodiment of a quick-release attachment system for mounting a control panel to the media storage system.

According to one embodiment, control panel 10 may be mounted to the media storage system 12 with a quick-release attachment system 60. One embodiment of a quick-release attachment system 60 for use with control panel 10 is shown in more detail in FIG. 6. Quick-release attachment system 60 may comprise mating couplers 62, 70 respectively mounted to region 30 on the storage libraries 20 and to control panel 10.

Coupler 62 may comprise a base portion 66 having tab portion 64 protruding therefrom. Coupler 62 may be mounted at its base 66 to region 30 of the storage libraries 20 using any suitable fastener, such as adhesive, screws, clips, to name a few. Alternatively, coupler 62 may be integrally formed as part of region 30. In addition, tab portion 64 may be manufactured from any suitable material, such as plastic or metal. Preferably, tab portion 64 is formed with a larger head portion and narrower neck portion so as to readily slide into and out of coupler 70 while holding firmly when inserted therein.

Coupler 70 comprises a hollow receiving member 72 with opening or chamber 75 formed therein. Opposing latch members 74 are provided adjacent chamber 75. Latch members 74 are biased toward one another by resilient member 76 (e.g., a spring). Mating couplers 62, 70 may be readily fitted together and released from one another. For example, mating couplers 62 may be pressed together in the direction illustrated by arrows 81 and pulled apart from one another in the direction illustrated by arrow 82.

Couplers 70 may be mounted to region 30 of the storage libraries 20 in any suitable manner. In one embodiment, couplers 70 are press-fit into an opening formed in region 30. Tabs 78, 79 are provided to secure couplers 70 to each of the storage libraries 20.

Of course, in other embodiments, one or more of the couplers 70 may be mounted to control panel 10 and the couplers 62 may instead be mounted to the storage libraries 20. It is also noted that the invention is not limited to use with any particular type of quick-release attachment system. Preferably, the quick-release attachment system is a push-on/pull-off (e.g., a snap-type) attachment system, such the one shown in FIG. 6 and just described. Other quick-release attachment systems may comprise clips, a slide-and-bracket assembly, a releasable adhesive, Velcro®, to name only a few alternatives. Preferably, the quick-release attachment system serves to secure the control panel 10 to storage library 20 so that connectors 52, 54 make a good electrical connection with connectors 53, 55.

In use, control panel 10 can be readily installed by pressing it onto region 30 of the desired storage library 20. Couplers 62, 70 are aligned with one another, and as the control panel 10 is pressed onto region 30, tab portion 64 is received in chamber 75 between latch members 74. Resilient member 76 serves to bias latch members 74 in a closed position and thus engage tab portion 64 of the coupler 62 within coupler 70. As such, the control panel 10 may be secured to the desired storage library 20.

Connectors 52, 54 are preferably automatically aligned with connectors 53, 55 when the couplers 62, 70 are aligned. When control panel 10 is mounted to the desired storage library 20, connectors 52, 54 are therefore linked to connectors 53, 55. Accordingly, signals (e.g., electrical power, I/O signals, etc.) are provided between control panel 10 and the media storage system 12 regardless of which storage library 20 the control panel 10 is mounted on.

Control panel 10 can be readily removed from one storage library 20 and mounted to another storage library (e.g., 22) as follows. As control panel 10 is pulled off of storage library 20, tab portion 64 slides out of chamber 75 and disengages from opposing latch members 74. Removal of control panel 10 also disconnects the connectors 52, 54 from connectors 53, 55. Accordingly, control panel 10 can be mounted to any of the other storage libraries 20. In addition, control panel 10 may be readily removed and reattached to the same storage library (e.g., in another position or in the same position). For example, the control panel 10 may be readily removed for repair, replacement, cleaning, or any other purpose, and then replaced.

What is claimed is:

1. A control panel for a media storage system having a plurality of storage libraries with a plurality of respective front panels, comprising:
    a frame assembly;
    an input device mounted to said frame assembly and to receive user input;
    an output device mounted to said frame assembly and to present output to a user; and
    a quick-release attachment system configured to releasably mount said frame assembly to each of the respective front panels of the plurality of storage libraries, wherein the quick-release attachment system allows said frame assembly to be released from the front panel of a first of the plurality of storage libraries and to be moved for mounting on the front panel of a second of the plurality of storage libraries.

2. The control panel of claim 1, further comprising a controller board mounted to said frame assembly.

3. The control panel of claim 1, wherein said quick-release attachment system has mating couplers provided on the control panel that are for coupling to respective mating couplers on any of the plurality of storage libraries.

4. The control panel of claim 1, wherein said quick-release attachment system is a push-on/pull-off system.

5. A media storage system, comprising:
    a plurality of storage libraries with a plurality of respective front panels;
    a control panel releasably mountable to each of the respective front panels of said plurality of storage libraries, wherein said control panel has an input device to accept user input and an output device to present output to a user; and a quick-release attachment system having mating couplers provided on said control panel and the front panel of each of said plurality of storage libraries, said quick-release attachment system allowing said control panel to be released from the front panel of a first of said plurality of storage libraries and to be moved for mounting on the front panel of a second of said plurality of storage libraries.

6. The media storage system of claim 5, further comprising a hot-swapable connector on said control panel, said hot-swapable connector providing electric signals between the control panel and the storage library to which the control panel is mounted.

7. The media storage system of claim 5, further comprising at least a power connector on said control panel, said power connector providing power to the control panel from the media storage system.

8. The media storage system of claim 5, wherein said quick-release attachment system is a snap-type system.

9. The media storage system of claim 5, wherein said quick-release attachment system has a tab portion receivable between opposing latch members.

10. The media storage system of claim 5, further comprising:
a control system operatively associated with said second storage library; and
a controller board provided on said control panel, said controller board linked to said control system when said control panel is mounted to said second storage library.

11. The media storage system of claim 5, further comprising mating electrical connectors provided on each of said plurality of storage libraries and on said control panel, said mating electrical connectors linking said control panel to a corresponding one of said plurality of storage libraries when the control panel is mounted to the corresponding storage library.

12. The media storage system of claim 5, wherein said quick-release attachment system is a push-on/pull-off system.

13. The media storage system of claim 5, wherein the media storage system is configured to receive a third storage library in addition to said plurality of storage libraries, and wherein the quick-release attachment system allows said control panel to be released from the front panel of the second storage library and to be mounted on a front panel of the third storage library after the control panel has been released from the second storage library.

14. A method comprising:
providing a plurality of storage libraries with a plurality of respective front panels in a media storage system, wherein a control panel is mounted to a respective first front panel of a first of the plurality of storage libraries, wherein the control panel has an input device to accept user input, and an output device to present output to a user;
releasing the control panel from the first storage library; and
after releasing the control panel from the first storage library, mounting the control panel to a respective second front panel of a second of the plurality of storage libraries,
wherein the control panel is releasably mountable by a quick-release attachment mechanism to the front panel of each of the first and second storage libraries.

15. The method of claim 14, further comprising:
adding a third storage library in addition to the plurality of storage libraries;
releasing the control panel from the second storage library; and
after releasing the control panel from the second storage library, mount the control panel to a front panel of the third storage library.

16. The method of claim 14, wherein releasing the control panel from the first storage library comprises disconnecting an electrical connector of the control panel from an electrical connector on the front panel of the first storage library, and wherein mounting the control panel to the front panel of the second storage library comprises connecting the electrical connector of the control panel to an electrical connector on the front panel of the second storage library.

* * * * *